(12) United States Patent
Wang

(10) Patent No.: US 7,705,440 B2
(45) Date of Patent: Apr. 27, 2010

(54) SUBSTRATE HAVING THROUGH-WAFER VIAS AND METHOD OF FORMING

(75) Inventor: James Jen-Ho Wang, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 76 days.

(21) Appl. No.: 11/851,857

(22) Filed: Sep. 7, 2007

(65) Prior Publication Data

US 2009/0065904 A1    Mar. 12, 2009

(51) Int. Cl.
*H01L 23/02* (2006.01)
*H01L 21/16* (2006.01)

(52) U.S. Cl. ..................... 257/678; 438/106

(58) Field of Classification Search ............. 438/674, 438/108, 109, 686, 106; 257/698, 774, 777, 257/686, E25.013, E21.503, 678; 228/110.1, 228/180.6, 123.1, 155, 178
See application file for complete search history.

(56) References Cited

U.S. PATENT DOCUMENTS

| 6,828,656 | B2 * | 12/2004 | Forbes et al. .............. 257/621 |
| 6,869,856 | B2 * | 3/2005 | Combi et al. .............. 438/410 |
| 2004/0072422 | A1 * | 4/2004 | Sinha .................... 438/667 |
| 2005/0208766 | A1 * | 9/2005 | Kirby et al. ............. 438/667 |
| 2006/0022341 | A1 * | 2/2006 | Sir et al. ................. 257/758 |
| 2006/0043569 | A1 | 3/2006 | Benson et al. |
| 2006/0261446 | A1 * | 11/2006 | Wood et al. ............. 257/621 |
| 2006/0275946 | A1 * | 12/2006 | MacNamara et al. ........ 438/73 |
| 2006/0278966 | A1 * | 12/2006 | Trezza et al. ............ 257/685 |
| 2007/0018179 | A1 * | 1/2007 | Kub et al. ................ 257/94 |
| 2007/0045732 | A1 * | 3/2007 | Lin et al. ................. 257/347 |
| 2007/0105338 | A1 * | 5/2007 | Lerner et al. ............. 438/430 |

* cited by examiner

*Primary Examiner*—Davienne Monbleau
*Assistant Examiner*—Nikolay Yushin

(57) ABSTRACT

An annular trench region is formed at a semiconductor substrate of an electronic device that defines a conductive plug of the through-wafer via, wherein the conductive plug includes an undisturbed portion of the semiconductor substrate.

20 Claims, 8 Drawing Sheets

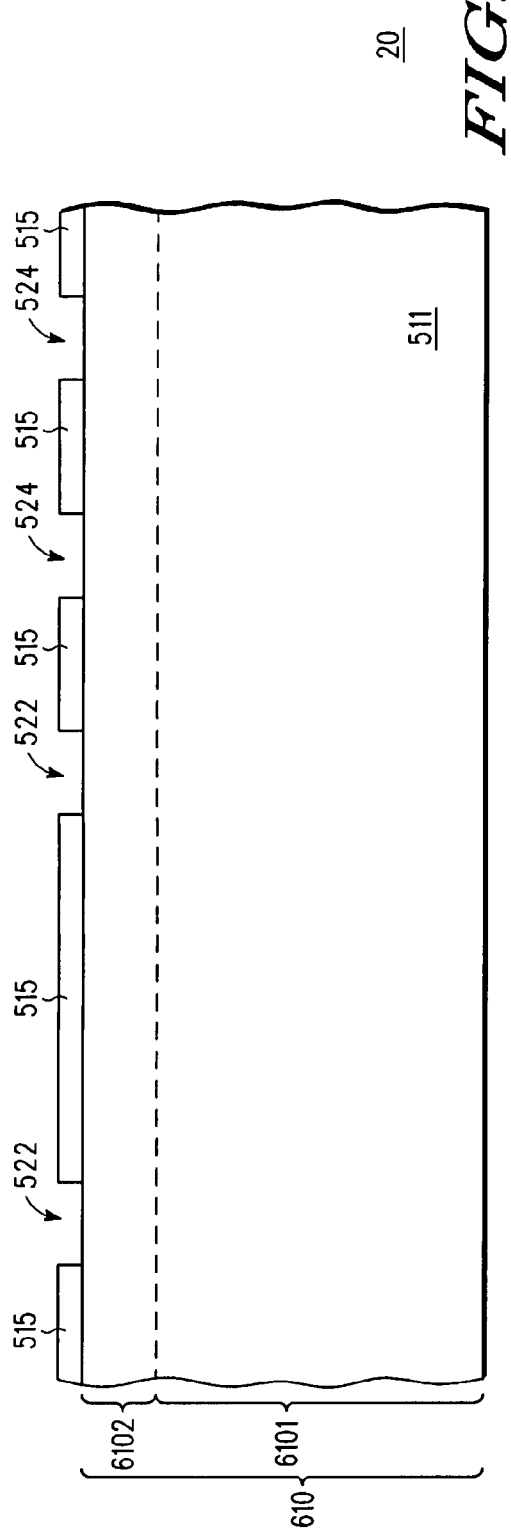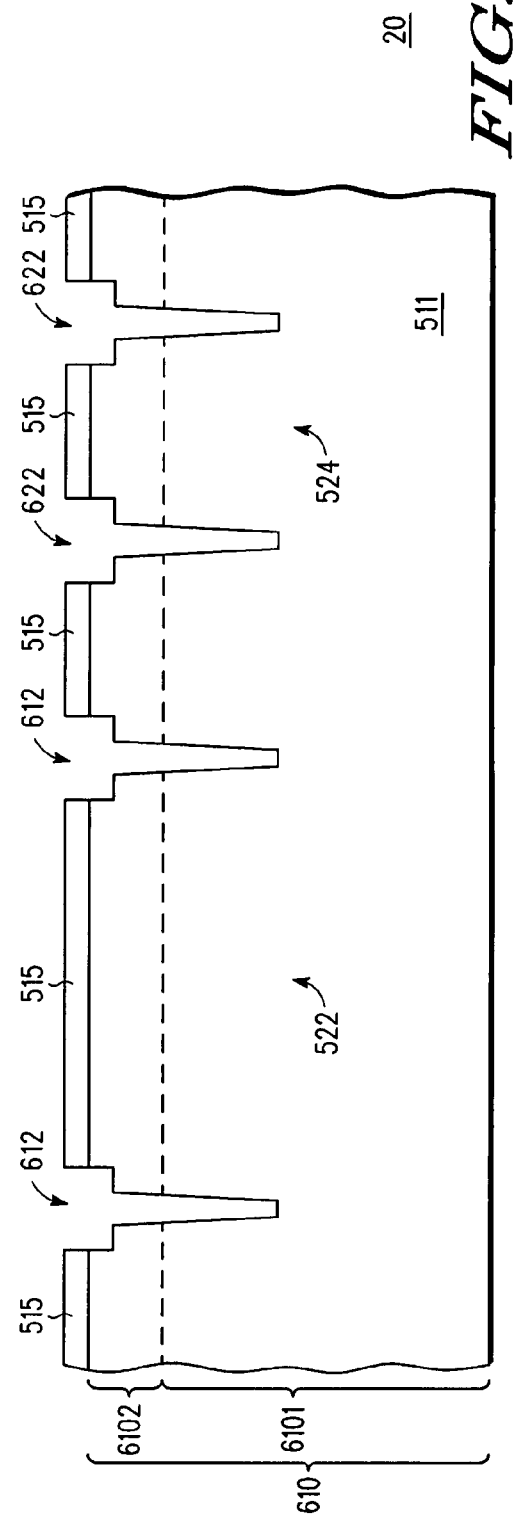

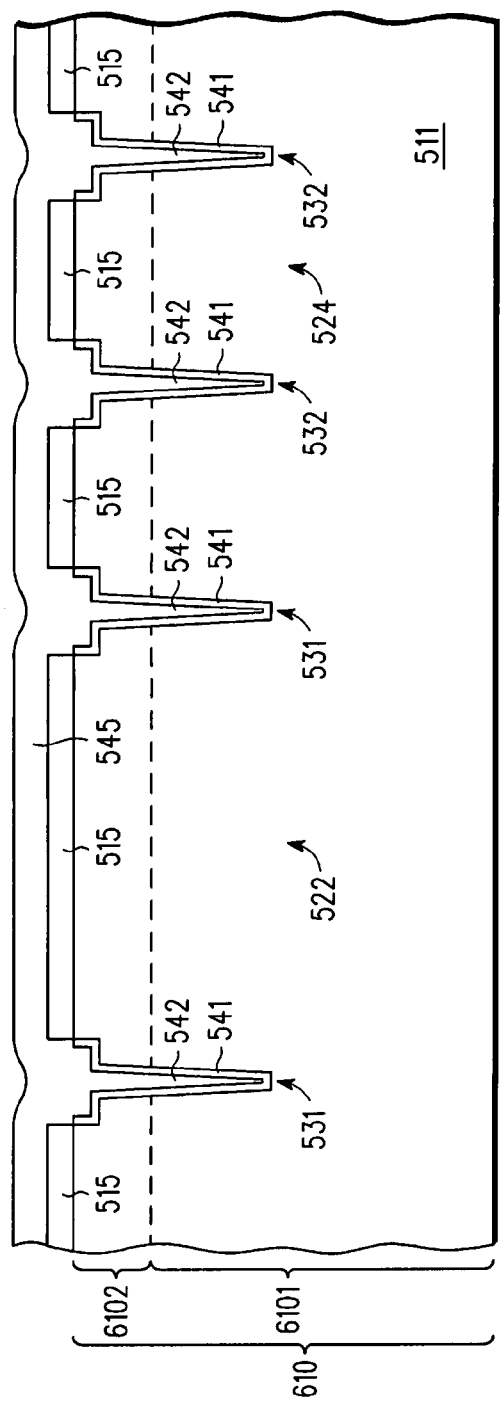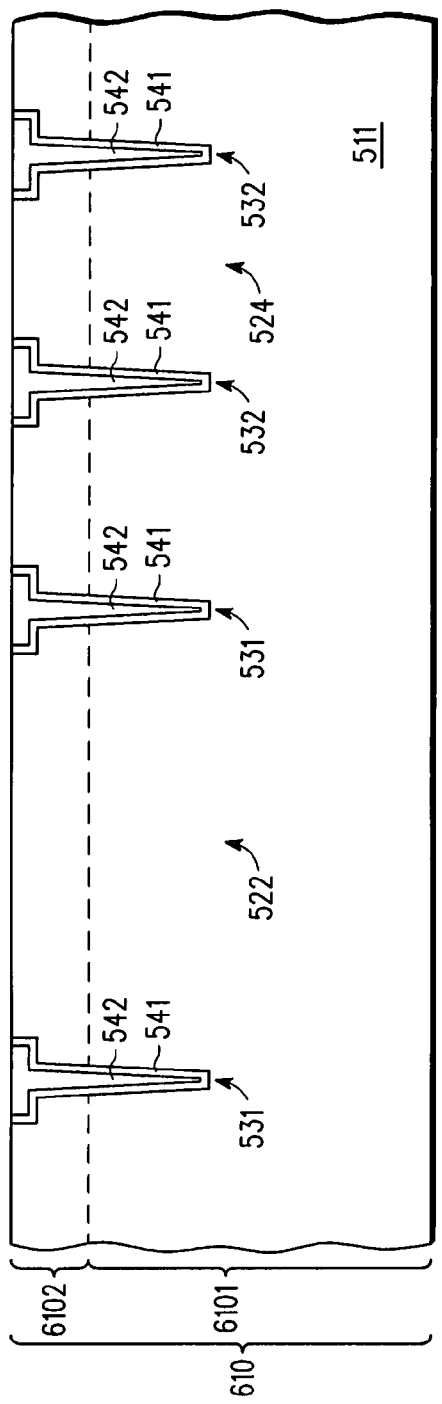

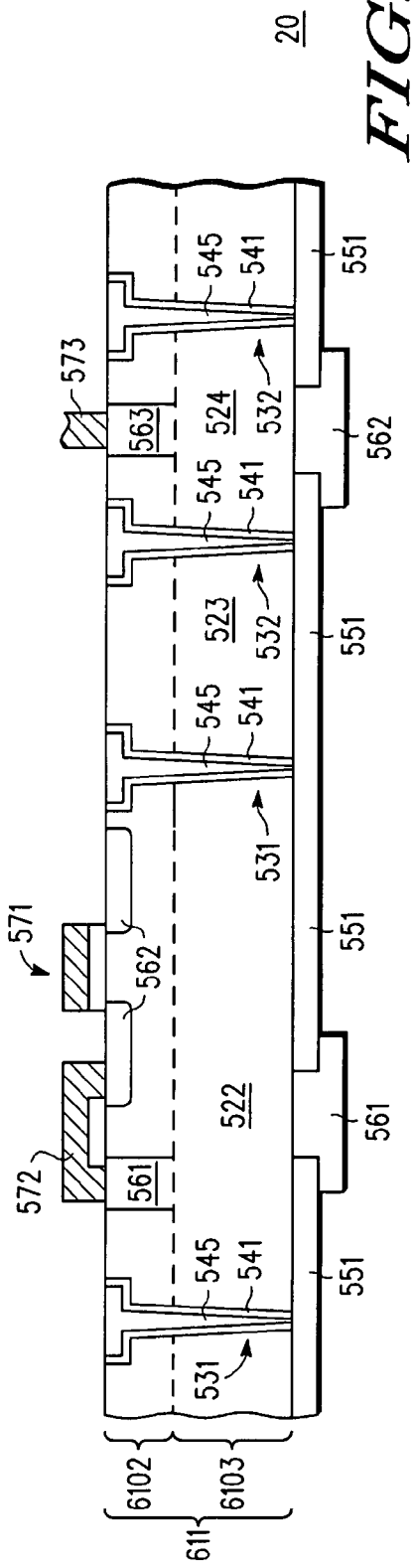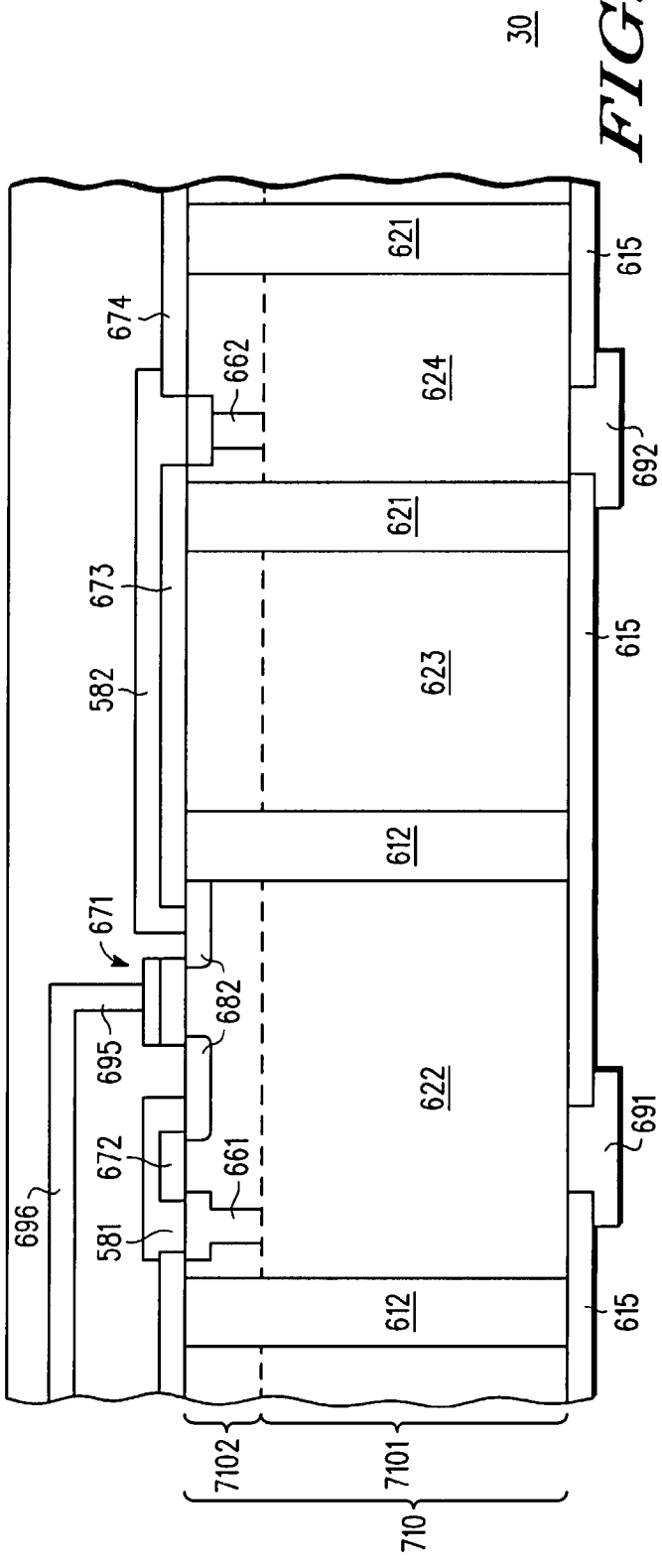

SUBSTRATE HAVING THROUGH-WAFER VIAS AND METHOD OF FORMING

FIELD OF THE DISCLOSURE

The present disclosure relates generally to electronic devices, and more particularly to electronic devices utilizing through-wafer vias.

BACKGROUND

Electrical connections between an integrated circuit device formed at one substrate and another integrated circuit device formed at a different substrate can be achieved by stacking one of the integrated circuit devices on top of the other backside-to-frontside to create a ledge at the bottom device. When stacked in this manner, wire bonds can be formed between interconnects at the ledge of the bottom integrated circuit device to interconnects at the top integrated circuit device or at an underlying substrate, such as a package substrate. Alternatively, direct face-to-face flip-chip bonding between two integrated circuit devices can be achieved by forming conductive bumps at one of the devices, and bonding the devices together face-to-face. In yet another embodiment, direct back-to-front bonding between two integrated circuits can be achieved by forming through-wafer vias that include conductive bumps at the back-side of one of the devices and bonding the devices back-to-front. Current practices of forming through-wafer vias include forming a metal plug surrounded by an insulating layer through the substrate of the integrated circuit, whereby the insulating layer isolates the metal plug from the surrounding semiconductor substrate material. During operation a signal is provided between the backside of the integrated circuit's substrate to a frontside of the substrate through the metal plug. Forming metal through-wafer vias such as these can require a number of difficult processes, and create material miss-match stresses that can damage a single crystal substrate, especially when elevated temperature are used subsequent to formation of device structures at the frontside of the integrated circuit. Therefore, a device and method overcoming these issues would be useful.

BRIEF DESCRIPTION OF THE DRAWINGS

FIGS. 9-13 include an illustration in cross-sectional view of an alternate embodiment of forming through-wafer vias in accordance with a specific embodiment of the present disclosure using frontside wafer processing;

FIG. 14 includes an illustration of a substantially completed device in accordance with a specific embodiment of present disclosure.

DETAILED DESCRIPTION OF THE DRAWINGS

In accordance with a specific embodiment of the present disclosure, an electronic device is formed having active layers formed at a frontside of a semiconductor substrate and through-wafer vias. The through-wafer vias are formed though the substrate by forming an isolation trench region surrounding a portion of the semiconductor substrate. Within the perimeter of the isolation trench region a conductive through portion of the through-wafer via is formed that can transmit a signal between a frontside structure of the active layers and a backside of the electronic device. Such a signal can be a voltage or current reference signal, e.g., Vdd or Vss, or a data signal. The isolation trench region of the through-wafer via can be formed using backside processing techniques or frontside processing techniques. Specific embodiments of the present disclosure will be better understood with reference to the specific embodiments illustrated at FIGS. 1-16.

Figure 1:
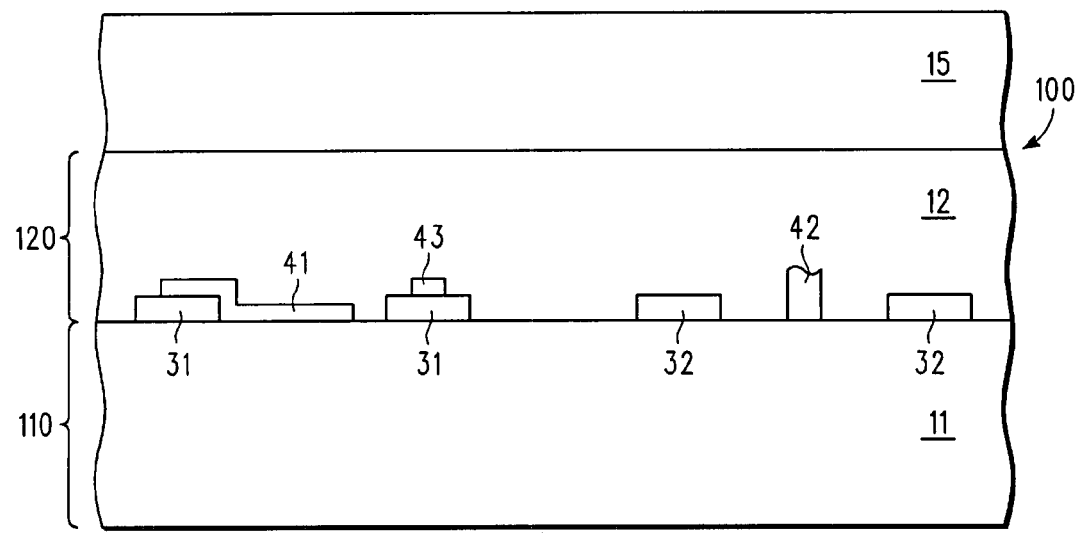
FIG. 1 includes an illustration of a cross-sectional view of a semiconductor workpiece in accordance with a specific embodiment of the present disclosure.

FIG. 1 illustrates a workpiece 10 that includes an electronic device 100, such as an integrated circuit device that has been temporarily attached to a handling substrate 15. The electronic device 100 includes front-end-of-line and back-end-of-line features at level 120 and a substrate 11 at level 110, through which through-wafer vias are formed.

As used herein, the term "through-wafer via" is intended to mean a structure that extends between two planes defined by two major surfaces of a substrate of a device, where the through-wafer via includes a conductive through-portion that is a conductive structure that extends between the two planes to transmit a signal through the substrate, i.e., a signal that is transmitted from one of the two planes to the other. It will be appreciated that the conductive through-portion of the through-wafer via can provide electrical contact locations at both major surfaces.

The term "substrate" is intended to mean a base material that can be either rigid or flexible and may include one or more layers of one or more materials, or combinations of materials, which can include, but are not limited to, glass, polymer, metal, semiconductor or ceramic materials. The reference point for a substrate is the beginning point of a process sequence. The substrate 11 at level 110 can be a bulk semiconductor substrate that can be monocrystalline and P-doped or N-doped (conductivity type), or a combination of a bulk semiconductor substrate and an epitaxial layer formed overlying the bulk semiconductor substrate. The epitaxial layer can have the same or different conductivity type as the bulk substrate. Substrate 11 can include other embodiments such as a silicon on insulator (SOI) substrate. For purposes of discussion it is assumed that the substrate 11 includes a bulk semiconductor substrate that is P-doped and an overlying epitaxial layer that is N-doped.

In one embodiment, such as when backside processing is used to form the vias disclosed herein, the substrate 11 is a thick substrate used during front-end processing, e.g., 625 micro-meters, that has been thinned to an end thickness of less than 100 micro-meters, such as from 20 micro-meters to 100 micro-meters, 20 to 75 micro-meters, or approximately 30 micro-meters after being attached to handling substrate 15. The thickness of the substrate 11 is selected to accommodate subsequent formation of through-wafer vias. It will be appreciated that the substrate is typically thinned after being attached to the handling substrate 15 to assure appropriate rigidity and to reduce breakage at semiconductor device 10.

Level 120 represents the level at which back-end-of-line and front-end-of-line layers overlying a frontside of substrate 11 are formed. For example, front-end-of-line features, such as transistor gate structures and contact plugs, and back-end-of-line features, such as horizontal routing layers and vertical connections between horizontal routing layers reside at level 120. Note that the term contact plug is intended to mean a conductive structure that connects a front-end-of-line feature or substrate location to a back-end-of-line feature.

FIG. 1 illustrates a cross-sectional view of an annular dielectric region 31 and an annular dielectric region 32. The annular dielectric regions 31 and 32 are dielectric structures having an annular shape, as further described herein, and are formed at locations where a backside etch through the substrate 11 will terminate. Further illustrated at level 120 is an interconnect 41 and an interconnect 42 that electrically connect portions of substrate 11 to features at level 120 or to other locations of substrate 11 (not illustrated). Interconnect 42 is a contact plug, while interconnect 41 can be a front-end-of-line interconnect, such as a polysilicon interconnect, between substrate 11 and another front-end-of-line feature. A horizontal interconnect 43 that is further illustrated at layer 120, can be a metal interconnect, such as copper, that is formed overlying a portion of the annular dielectric region 31. Although not explicitly shown at FIG. 1, other structures and devices, such as transistors, can be formed within the perimeters of annular dielectric region 31 and annular dielectric region 32, as well as between the annular dielectric region 31 and annular dielectric region 32.

Figure 2:
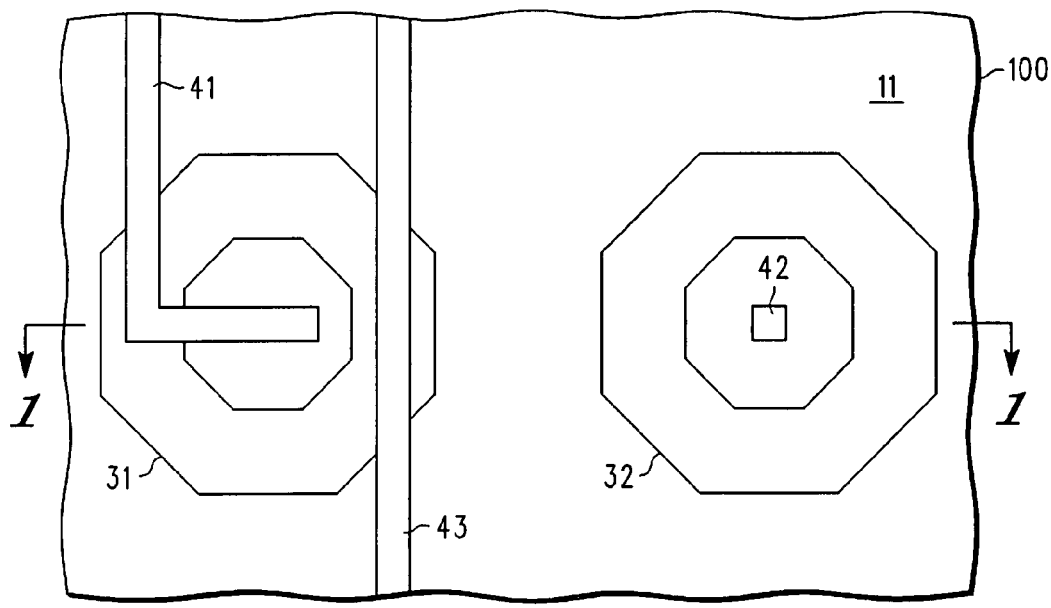
FIG. 2 includes an illustration of a plan view of the workpiece of FIG. 1.

FIG. 2 includes a plan view of a portion of the features of semiconductor device 100 of FIG. 1. Specifically illustrated at FIG. 2 is the interconnect 41, the annular dielectric region 31, the annular dielectric region 32, horizontal interconnect 43, contact plug 42, and the portions of substrate 11 not covered by one of the listed structures. Note that back-end-of-line features are not illustrated at FIG. 2. The term "annular," as used herein, is intended to mean a structure of any geometric shape with an opening defined by an inside perimeter. Therefore, it will be appreciated that an annular structure can have an outside perimeter that is a circle, a polygon, such as a square or an octagon, or any other shape that has an opening in the interior. The inside perimeter defining the opening is a geometric shape that can be the same or different than the shape of the outside perimeter. FIG. 2 specifically illustrates an annular region 31 that has an octagonal outside perimeter and an octagonal inside perimeter.

Figure 3:
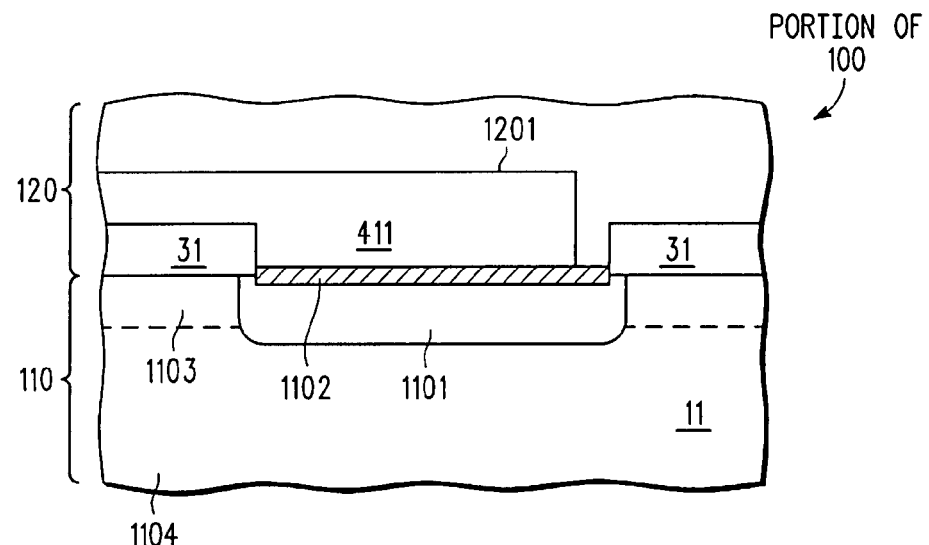
FIG. 3 includes an illustration of a portion of the workpiece of FIG. 1 in accordance with a specific embodiment of the present disclosure.

FIG. 3 illustrates an alternate embodiment of a portion of the workpiece 10. Specifically, FIG. 3 illustrates in greater detail a portion of workpiece 10 within the inside perimeter of the annular dielectric region 31 having a region 1101 that extends through an N-type epitaxial layer 1103 of the substrate 11 to the underlying P-type bulk substrate 1104. The region 1101 has been doped to have the same conductivity type as the bulk substrate portion of substrate 11 to form an electrical contact through the epitaxial layer 1103 to the bulk substrate 1104. A silicide region 1102 has also been formed at substrate 11 within the annular dielectric region 31 to reduce resistivity. In alternate embodiments, only one of the doped region 1101 and the silicide region 1102 can be used, or neither of the doped region 1101 and the silicide 1102 are used when an epitaxial layer 1103 is not present, or the region 1101 can still be used when no epitaxial layer overlies a bulk substrate as described. Note that in alternate embodiments, as illustrated herein, illustration the region 1101 can be smaller than the inner annular ring 31 in order to allow other functional devices to occupy neighboring area within the annular ring formed by annular dielectric region 31.

The conductive interconnect 411 illustrated at FIG. 3 is a planarized interconnect, unlike the corresponding conductive interconnect 41 illustrated at FIG. 1, which is illustrated to follow the contour of the annular dielectric region 31. It will be appreciated that the planarized interconnect 411 of FIG. 3 can be formed using a dual damascene type process.

Figure 4:
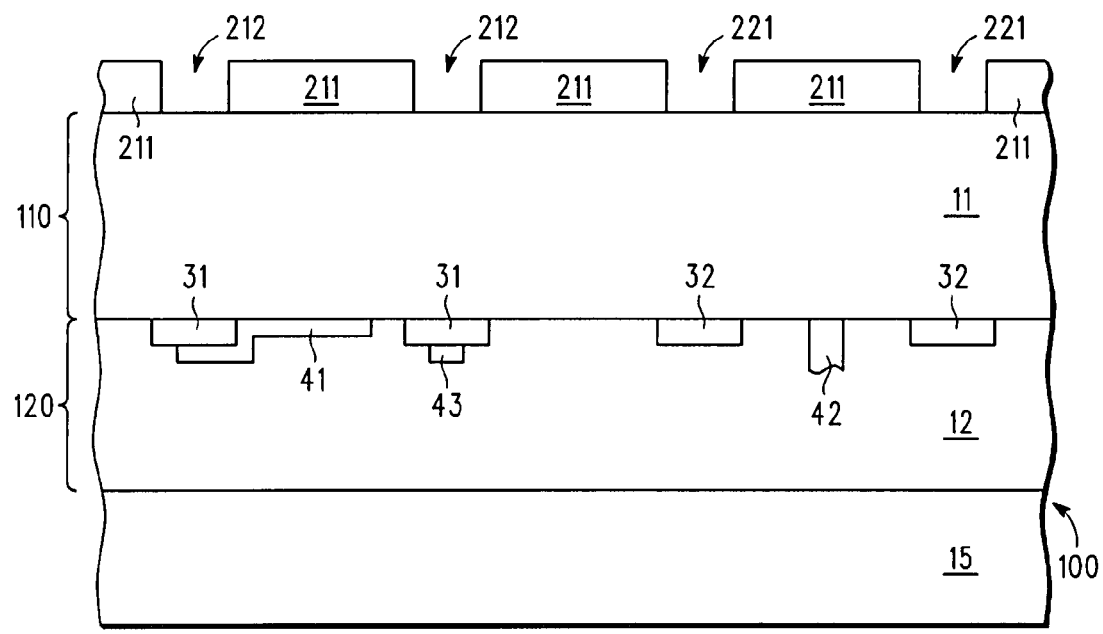
FIGS. 4-8 include illustrations of a workpiece of FIG. 1 at various stages of the formation of through-wafer vias processed from wafer backside in accordance with a specific embodiment of the present disclosure.

At FIG. 4, the workpiece 10 has been flipped relative to the illustration of FIG. 1 such that the handling substrate 15 is at the bottom of FIG. 4 and the substrate 11 is at the top. A patterned mask layer 211 has been formed overlying the backside of substrate 11, and has a trench opening 212 and a trench opening 221. Trench openings 212 and 221 each represent annular trench openings of the patterned mask layer 211 that overlie annular dielectric regions 31 and 32, respectively. The patterned mask layer 211 is formed from a material that allows material of substrate 11 to be removed selectively relative the material of patterned mask layer 211 during subsequent etch steps.

Figure 5:
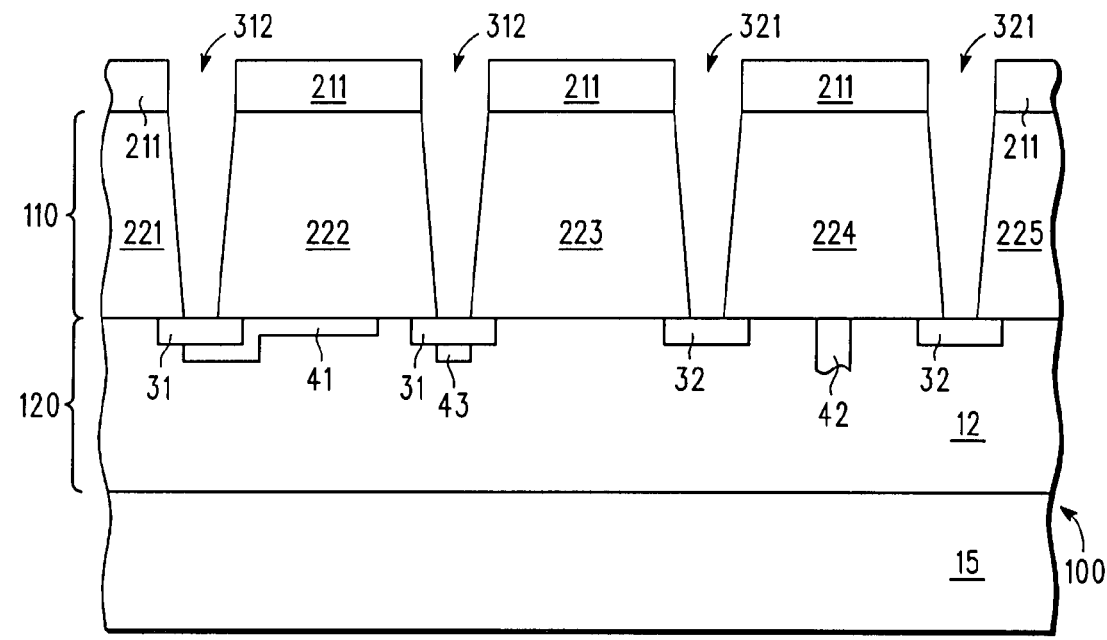

FIG. 5 illustrates workpiece 10 after the formation of backside trench openings 312 and 321 at substrate 11. The backside trench openings 312 and 321 are formed using an etch selective to the material of substrate 11 and the material of the annular dielectric regions 31 and 32, whereby trench openings 312 and 321 are formed through the substrate 11. The etch used to form backside trench openings 312 and 321 etch stops at the front side of the semiconductor device 100 at the underlying annular dielectric regions 31 and 32, respectively. A slope of the sidewalls of the trench openings 312 and 321 can vary based upon process technology being used, but typically are selected to facilitate subsequent dielectric formation within the trench openings. Therefore, when complete, the etch through the substrate 11 exposes portions of annular dielectric regions 31 and 32.

In one embodiment, the etch processes used to etch substrate 11 are selective to the material of substrate 11 such that the annular dielectric regions 31 and 32 act as an etch stop material to the etch processes. In an alternative embodiment, the etch process used to etch through the substrate 11 can be a timed etch. The etch process typically is an anisotropic etch process that results in a narrowing of the trench opening as it is formed. Therefore, the width of the trench openings 312 and 321 formed at patterned mask layer 211 is based upon the specific characteristics of the etch being used and the thickness of the substrate 11, e.g., level 110, to assure exposure of the underlying annular dielectric regions 31 and 32.

Figure 6:
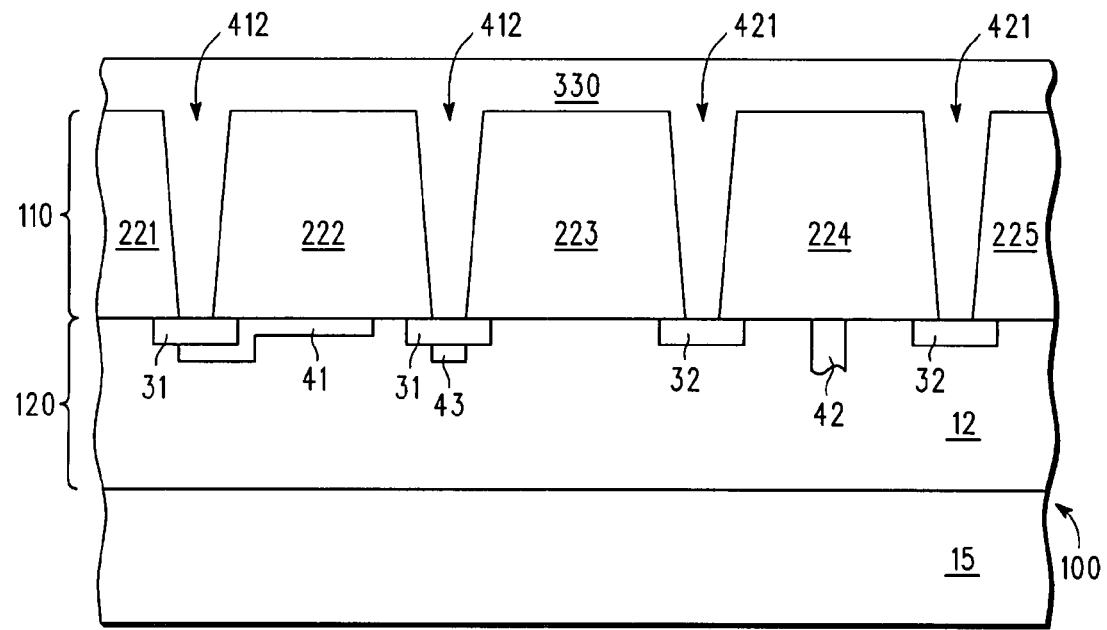

FIG. 6 illustrates workpiece 10 following the formation of layer 330 overlying the workpiece 10 illustrated in FIG. 5. The layer 330 substantially fills the trench openings 312 and 321 to form filled trench regions 412 and 421. The layer 330 may include a single layer, or a plurality of layers, including a dielectric layer. In one embodiment, the layer 330 includes multiple layers including a first portion that is a dielectric layer that coats sidewalls of substrate portions 222-224 exposed at the trench openings 312 and 321. This first portion of layer 330 can be an ambient oxide layer having a thickness of, for example, less than 10 nano-meters that is formed using ambient oxygen. For example, plasma oxidation with asher can be used to form the first portion of layer 330. Once the ambient oxide is formed, a deposition process, such as a low temperature deposition process can be used to fill the trench openings. The low temperature deposition process can include a plasma deposition process, and can be used to fill in the remaining portions of the trench openings 312 and 321 with a dielectric such as silicon dioxide. In another embodiment, layer 330 can represent a single dielectric layer that fills the openings without first forming the ambient oxide layer. Alternatively, a conductive material can be used to fill the remaining portions of the trench openings 312 and 321 after a dielectric is formed that coats the sidewalls of the openings 312 and 321. It will be appreciated that trench openings 312 and 321 of FIG. 5 can be filled using low temperature processes after all higher temperature processes used to form workpiece 10 have been completed, such as after formation of front-end-of-line structures, such as transistors.

Figure 7:
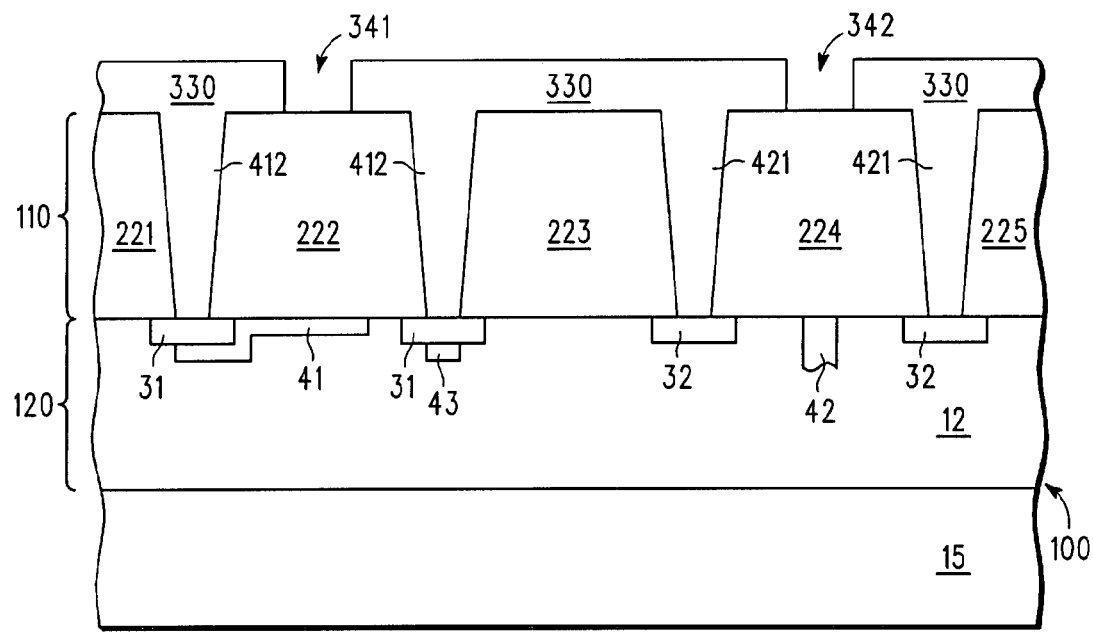

FIG. 7 illustrates an embodiment wherein layer 330 is a dielectric layer that has been patterned to create backside openings 341 and 342, thereby exposing backside surface locations of substrate 11, one at portion 222 and another at portion 224, where backside contacts can be subsequently formed. It will be appreciated that while the layer 330 is shown as planarized, when small dimples are tolerable planarizing won't be needed. Layer 330 can also be completely removed from that portion of layer 330 overlying the backside of semiconductor device 100 prior to forming a new dielectric layer where openings 341 and 342 can be formed. Multiple openings can be formed at layer 330 to a specific portion of substrate 11, such as at portion 222.

It will be appreciated, that the trench regions 412 and 421 are structures formed within trench openings 312 and 321, and isolate the conductive through-portions of through-wafer vias from each other and other conductive portions of substrate 11. For example, portion 222 of substrate 11 is a conductive structure formed from substrate 11 that includes a conductive through-portion of a through-wafer via. Portion 222 can be considered an island of semiconductor material in that it is surrounded by trench region 412 that physically separates portion 222 from all other portions of substrate 11. Furthermore, the portion 222 of substrate 11 is electrically isolated from all other portions of the substrate 11 in that current cannot flow from portion 222 through trench region 412 to other portions of substrate 11 under expected operating conditions. Similarly, semiconductor portion 224 is a conductive structure formed from substrate 11 that includes a conductive through-portion of a through-wafer via. Therefore, the contact plug 42 is in physical contact with a conductive through-portion that includes portion 224 to facilitate an electrical connection between the contact plug 42 and a backside of portion 224. Similarly, an electrical connection exists between the interconnect 41 and a conductive through-portion that includes portion 222 of substrate 11. Note that when portion 222 or 224 include an epitaxial layer formed overlying a bulk substrate of a different conductivity type, that the conductive through-portion at each portion 222 or 224 will include the bulk semiconductor substrate having a first conductivity type, and a portion of the overlying epitaxial layer that extends through the epitaxial layer and has the same conductivity type as the underlying semiconductor substrate.

Figure 8:
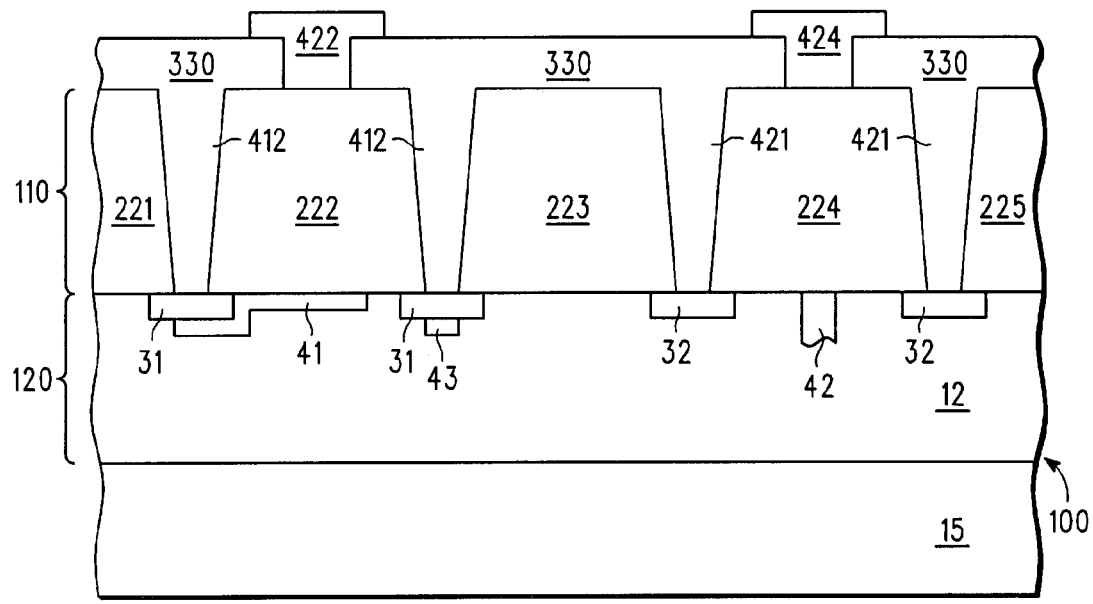

Through-wafer vias at FIG. 8 have been substantially completed by including conductive bump structures 422 and 424. The conductive bump structures contact backside locations of conductive through-portions 222 and 224 of substrate 11. Conductive bump structure 422 is part of the through-wafer via that includes portion 222 of substrate 11 and trench region 412, and is electrically connected to contact structure 41 through portion 222. Conductive bump structure 424 is part of the through-wafer via that includes portion 224 of substrate 11 and trench region 421, and is electrically connected to contact structure 42 through portion 224. The conductive bump structures 422 and 424 can include any one of many types of bump structures capable of connecting to a backside of device 110, and an underlying substrate, such as an integrated circuit device or printed circuit board. Note that doped regions and silicide regions can be formed at the backside of substrate 11 prior to formation of the conductive bump structures 422 and 424 to facilitate an electrical contact between the bump structures 422 and 424 and the substrate 11.

It will be appreciated, that the actual dimension of the portions 222 and 224, such as their respective surface areas as viewed from a plan view, can vary based upon the number of frontside features to be formed at each respective portion, as well as by specific electrical requirements of the frontside feature receiving or providing a signal through a respective conductive through-portion of through-wafer via. For example, if a feature at an active layer of the electronic device 100 requires a low-resistance connection to an external structure, the contact area of the conductive through-portion of a through-wafer via can be greater than if the feature did not require as low of a resistance connection. For example, such as the area of the bulk semiconductor substrate of portion 222 in a plane parallel to a major surface of substrate 11 can be increased when a lower-resistance connection is required, or the area of a doped portion of an epitaxial layer having the same conductivity type as the bulk semiconductor substrate that extends through the epitaxial layer to the bulk semiconductor substrate can be increased to reduce resistance of the conductive through-portion.

Similarly, the contact area between a frontside feature and the conductive through-portion of the through-wafer via, which includes portion 224, can be increased to reduce resistance, by forming multiple doped portions through an epitaxial layer having the same conductivity type as the bulk substrate. For example, a conductive through-portion of a through-wafer via can have multiple doped region through the epitaxial layer to reduce the resistance to a feature at level 110.

FIGS. 9-13 illustrate an alternate embodiment of the present disclosure, whereby through-wafer vias having conductive through-portions formed from a semiconductor are formed from the frontside of a semiconductor device, as opposed to from the backside as previously discussed. Referring to FIG. 9, workpiece 20 is illustrated to include having a semiconductor substrate 511 at level 610 with a patterned mask layer 515 formed thereupon at which an electronic device, e.g., an integrated circuit device, is to be formed. Substrate 511 is illustrated to include a bulk substrate at level 6101 and an epitaxial layer at level 6102 formed overlying the bulk substrate at level 6101. Note that the semiconductor substrate 511 is not illustrated to have frontside features formed thereupon, nor has semiconductor substrate 511 been substantially thinned. However, it will be appreciated that front-end layers, such as field oxide, can be formed prior to forming patterned mask 515. Substrate 511 can have any thickness prior to thinning, for example, semiconductor substrate 511 can have a thickness great enough to provide rigidity and support during subsequent formation of frontside features of the device. Typically the thickness of semiconductor substrate 511 will be greater than approximately 600 micro-meters.

The patterned mask layer 515 includes openings 522 and 524 that define locations where annular trench openings are to be subsequently formed within substrate 511. The openings 522 and 524 of mask layer 515 can be purposely wider than the width of a trench opening that can be formed subsequently. Note that that the patterned mask 515 can represent a photoresist or a hard mask layer, such as an oxide. In FIG. 12. patterned mask 515 has been completely removed, though in other embodiments, such as when patterned mask 515 is a hard mask, it can remain on the workpiece 20 as a dielectric layer.

Referring to FIG. 10, deep trench openings 612 and 622 have been formed by laser cutting. The deep trench openings define semiconductor portions 522 and 524, at which conductive through-portions of through-wafer vias will be formed. In addition, the deep trench opening 612 and 622 can include etching portions at the top of the deep trench openings 612 and 622 prior to laser cutting as part of a cleaning process that removes oxide prior to cutting, and can also include an etch after cutting to remove residue. The use of laser cutting is faster than traditional etch techniques and allows for formation of deeper trench openings. For example, trench openings greater than 20 micrometers, greater than 100 micrometers, greater than 150 micrometers, and greater than 200 micrometers can be formed, including trench openings that are approximately 200 micrometers.

In one embodiment, the each of the deep trench openings 612 and 622 are formed by one or more passes of a laser cutting technique that cuts into substrate 511. In this manner, deep trench opening 612 is an annular opening formed around a semiconductor portion 522, and deep trench opening 622 is an annular opening formed around a semiconductor portion 524. Laser cutting can damage single crystal semiconductor substrates and laser ablation residue can occur near deep trench openings 612 and 622. Therefore, an etch process, such as a dry etch process, can be used following laser cutting to clean off residue and repair damage at the exposed surfaces of substrate 611, including surfaces within deep trench openings 612 and 622.

Using laser cutting techniques, the depth of deep trench openings 612 and 622 can be obtained mostly through laser ablation, however, the width of the trench openings can be increased by dry etching as needed. The deep trench openings 612 and 622 are formed deeper than an end thickness of substrate 511 to accommodate electrically isolating semiconductor portions 522 and 524 from each other and other semiconductor portions of the substrate 511 after a subsequent thinning process. It will be appreciated that the deep trench openings 612 and 622 can be formed using traditional etching techniques or laser cutting techniques.

FIG. 11 illustrates workpiece 20 after filling the deep trench openings 612 and 622 to form trench regions 531 and 532, that by virtue of being formed within the deep trench openings, define an outer perimeter of conductive through-portions of through-wafer vias, that include semiconductor portions 522 and 524. The deep trench openings 612 and 622 can be filled with a dielectric layer 541 that coats sidewalls of portions 522 and 524 and a fill layer 542. The dielectric layer 541 can be an ambient oxide as previously described, or other dielectric. The dielectric layer 541 preferably is sufficiently thick to electrically isolate any subsequent trench fill material, if conductive, from substrate 511 and to reduce undesirable parasitic capacitance and surface charging.

The dielectric layer 541 can comprise an oxide, nitride, other insulating materials, or combinations thereof. A fill layer 542 is formed after dielectric layer 541. The fill layer 542 can be a dielectric or conductive material, such as a semiconductor or metal. In one embodiment, a polysilicon can be used. It can be desirable for fill layer 542 to have thermal expansion characteristics that closely match the thermal expansion characteristics of the substrate 511. Therefore, layer 542 can include a polysilicon material deposited using a deposition process, such as a chemical vapor deposition process. For example, filling the deep trench openings 612 and 622 with polysilicon, which has a thermal expansion characteristic, such as a coefficient of thermal expansion, that matches that of silicon substrate 511, allows the through-wafer vias to be formed prior to high temperature processes used and many front-end-of-line features. Therefore, a high-temperature process, such as a low pressure chemical vapor deposition process, can be used to fill deep trench openings 612 and 622 without adversely affecting workpiece 20 during the fill process or during subsequent processes used to form front-end-of-line features. For example, a polysilicon fill material and a monocrystalline silicon substrate can both have a coefficient of thermal exposing of about 2.7 ppm/C while a dielectric fill material, such as at opening 321 of FIG. 5, has a coefficient of thermal exposing of about 0.6 ppm/C.

FIG. 12 illustrates workpiece 20 of FIG. 11 after planarization or etching to remove an uppermost portion of the fill materials 542 and partial or total removal process of the patterned mask 515. Note that that the patterned mask 515 has been completely removed at FIG. 12, though in other embodiments it can remain on the workpiece 20 as a dielectric layer.

FIG. 13 illustrates workpiece 20 after various front-end-of-line and back-end-of-line features have been formed, including a transistor including gate structure 571 and conductive interconnect 572. Note that the substrate 511 has been thinned from the backside to form substrate 522 at level 611, which includes level 6102 as previously described, and level 6103, which is the remaining portion of the bulk substrate of level 6102. Once thinned, fill material of each trench region 531 and 532 is exposed. The substrate 511 can be thinned after formation of front-end-of-line and back-end-of-line features. A patterned dielectric layer 551 has been formed at the backside of the substrate to create openings at which conductive bump structures 561 and 562 have been formed to be in electrical contact with conductive through-portions of through wafer vias at the backside of semiconductor portions 522 and 524 of substrate 511.

FIG. 14 illustrates a cross-sectional view of a completed device 30 having through-wafer vias in accordance with the present disclosure. Device 30 includes a substrate at level 710 and first and second through-wafer vias. The substrate at level 610 includes a bulk semiconductor substrate at level 7101 and an overlying epitaxial layer at level 7102 having an opposite conductivity type than the bulk semiconductor substrate. The first through-wafer via includes a conductive bump 691 and a first conductive through-portion that forms an electrical connection to the front side metal interconnect 581. Note that the first conductive through-portion is formed at substrate portion 622 and includes a portion 661 of the epitaxial layer and the bulk semiconductor substrate of portion 622, where the portion 661 of the epitaxial layer is a doped region that has the same conductivity type as the bulk semiconductor substrate at level 7101 and extends through the epitaxial layer, thereby forming a bulk substrate contact that provides an electrical connection between front side metal interconnect 581 and bulk semiconductor substrate at level 7101 though the N-doped epitaxial layer at level 7102. In addition, because the conductive through-portion of the first through-wafer via is formed from the bulk semiconductor substrate, both the conductive through-portion of the through-wafer via and the bulk semiconductor substrate at level 7101 of the device being formed have the same crystal orientation. Note that the epitaxial layer at level 7102 can also have the same crystal orientation as the bulk substrate. The second through-wafer via of FIG. 14 includes a conductive bump 692 and a second conductive through-portion that forms an electrical connection to the front side metal interconnect 582. Note that the conductive through-portion of the second through wafer via is formed at substrate portion 624 and includes a portion 662 of the epitaxial layer at level 7102 and the bulk semiconductor substrate of portion 624, where the portion 662 of the epitaxial layer is a doped region that has the same conductivity type as the bulk semiconductor substrate at level 7101, thereby forming electrical connection to front side metal interconnect 582.

A transistor that includes gate structure 671 and source/drain regions 682 have been formed at the epitaxial layer of workpiece 30. A conductive structure 581 connects the conductive through-portion of the first through-wafer via to one of the source/drain regions 682 of the transistor, to allow a current to flow between the source drain region 682 and an external device (not shown) through conductive structure 581, conductive through-portion of the first though-wafer via that includes the epitaxial region 661 and portion 622, the bulk semiconductor substrate at level 6101, and conductive bump 691. Similarly, a current is allowed to flow from the transistor's other source/drain region through conductive structure 582, conductive through-portion of the second through-wafer via that includes the epitaxial region 662 and portion 624 of the bulk semiconductor substrate at level 6101, and conductive bump 692. Note a contact plug 695 connects the conductive gate of gate structure 671 to a metal line 696 at an overlying interconnect layer. Though not specifically illustrated, it will be appreciated that additional transistors and structures can be formed within the annular regions defined by annular trenches 612 and 621.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

Figure 15:
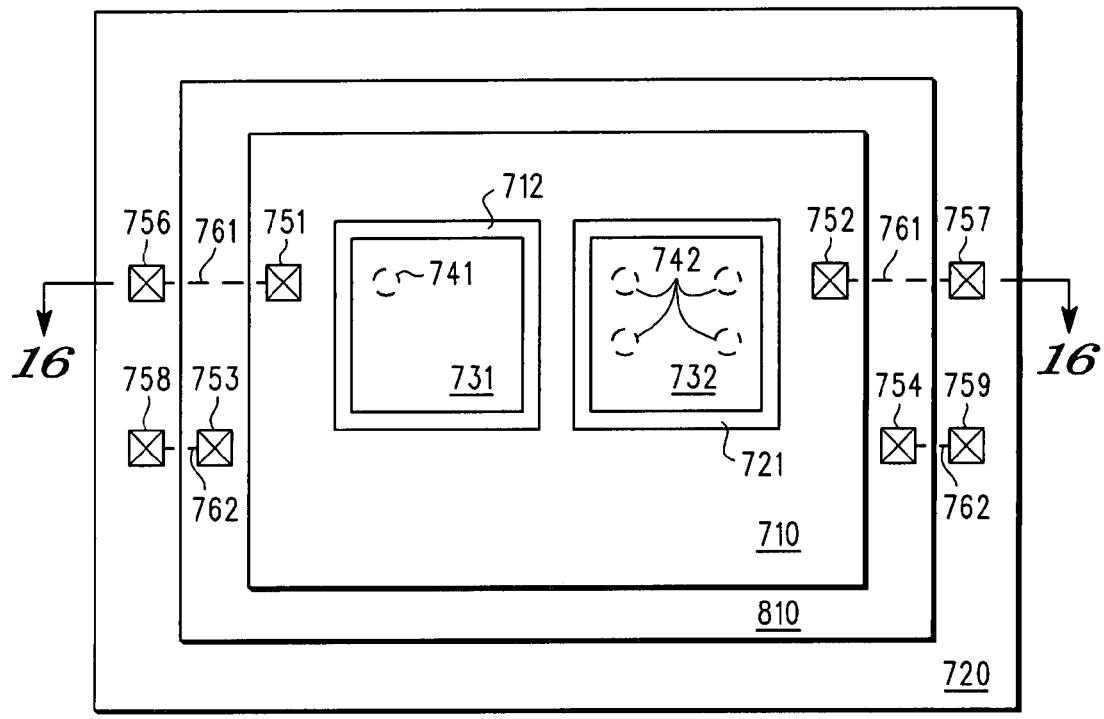
FIG. 15 includes a plan view of a packaged device in accordance with a specific embodiment of the present disclosure.
Figure 16:
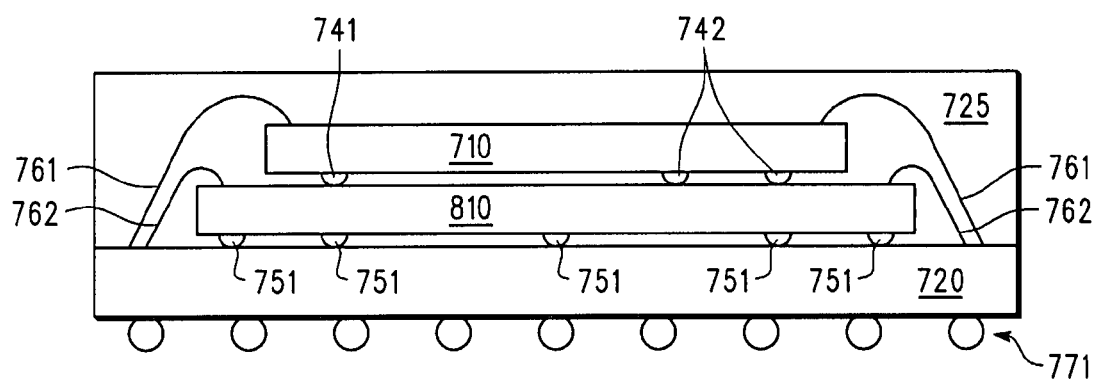
FIG. 16 includes a cross-sectional view of the packaged device of FIG. 15.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description. For example, the through-wafer vias disclosed herein can be formed through a SOI substrate by forming a conductive structure through the buried insulation layer of the SOI substrate during frontside processing. Also, it will be appreciated that a device having through-wafer vias was described herein can be an integrated circuit that is mounted back side-to-front side with another integrated circuit. In addition, such a device can be an integrated circuit that is mounted with its backside conductive bumps in electrical contact with a package substrate, or a printed circuit board. For example, FIG. 15 shows a plan view of an integrated circuit 710 stacked on an integrated circuit 810, which in turn is connected to a package substrate 720. Two through-wafer vias are illustrated at integrated circuit 710. One through-wafer via includes annular trench region 712, semiconductor substrate portion 731 and conductive bump at 741, while the other through-wafer via includes annular trench region 721, semiconductor substrate 732, and multiple conductive bumps 742. Bond pads 751 and 752 are also illustrated connected to bond pads 756 and 757 of package substrate 720 via wire interconnects 761. An outer perimeter of integrated circuit 810 is illustrated at FIG. 15 to include bond pad 753 and bond pad 754. Bond pads 753 and 754 are also illustrated connected to bond pads 758 and 759 of package substrate 770. FIG. 16 illustrates the package device of FIG. 15 from a cross-sectional view after being encapsulated by portion 725. Note that conductive bumps 751 of integrated circuit 810 are not illustrated in the plan view of FIG. 16. As illustrated, integrated circuit device 810 includes through wafer vias as described herein, and also includes wire bond pads to facilitate wire bonding. It will be appreciated that in other embodiments, integrated circuit device 810 can have only through wafer via, or only wire bond connections.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

To the extent not described herein, many details regarding specific materials, processing acts, and circuits are conventional and may be found in textbooks and other sources within the semiconductor and microelectronic arts. Other features and advantages of the disclosure will be apparent from the following detailed description, and from the claims.

What is claimed is:

1. An electronic device comprising:
    a semiconductor substrate comprising a first layer at a first level and a second layer at a second level, the first layer being of a first conductivity type, the second layer being of a second conductivity type, and the second layer overlying the first layer; and
    a through-wafer via comprising a portion of the semiconductor substrate surrounded by an annular trench, the through-wafer via comprising a portion at the second level in contact with the first layer to form a conductive through-portion at the through-wafer via, the portion at the second level having the first conductivity type.

2. An electronic device comprising:
    a semiconductor substrate having a crystal orientation and a a through-wafer via, the through-wafer via of the semiconductor substrate surrounded by an annular trench, the through-wafer via comprising a conductive through-portion and a source/drain region of a transistor.

3. The device of claim 2, wherein the through-wafer via and the source/drain region are of a first conductivity type, and the portion of the semiconductor substrate between the through-wafer via and the source/drain region is of a second conductivity type.

4. A method of forming an electronic device comprising:
forming, at a semiconductor substrate of the electronic device, an annular trench region that defines a through-wafer via that includes a first portion of the semiconductor substrate and a second portion of the semiconductor substrate; and
forming a transistor at the second portion of the semiconductor substrate and a conductive through-portion at the first portion of the semiconductor substrate, wherein forming the transistor further comprises doping a source/drain location at the second portion of the semiconductor substrate to form a source/drain region of the transistor.

5. The method of claim 4, wherein forming the annular trench region comprises:
forming an annular trench opening from a backside of the semiconductor substrate subsequent to forming the transistor, wherein the first and second portions of the semiconductor substrate are within the annular trench opening.

6. The method of claim 5, wherein forming the annular trench opening includes etching the semiconductor substrate to form the annular trench opening and etch stopping at a dielectric material.

7. The method of claim 5, wherein the semiconductor substrate has a thickness between approximately 20 and 100 micrometers.

8. The method of claim 7, wherein forming the annular trench region further comprises:
forming a dielectric at a sidewall of the annular trench opening.

9. The method of claim 4, wherein forming the through-wafer via further comprises:
forming an annular trench opening from a frontside of the semiconductor substrate prior to forming the transistor, wherein the first portion and the second portion of the semiconductor substrate is within the annular trench opening.

10. The method of claim 9, further comprising thinning the semiconductor substrate from a backside to expose the dielectric.

11. The method of claim 9, further comprising:
forming a dielectric at a sidewall of the annular trench opening.

12. The method of claim 11, wherein forming the dielectric at the sidewall further comprises filling the annular trench opening with the dielectric.

13. The method of claim 4, wherein the semiconductor substrate comprises an epitaxial layer overlying a bulk semiconductor substrate.

14. The method of claim 1, further comprises the semiconductor substrate having a thickness of less than 100 micrometers.

15. The method of claim 5, wherein forming the annular trench regions further comprises:
forming the an annular trench at a frontside of the semiconductor substrate;
filling the annular trench with a dielectric material; and
wherein forming the annular trench opening from the backside comprises etch stopping on the dielectric material.

16. A method of forming an electronic device comprising:
forming, at a semiconductor substrate of the electronic device, an annular trench region that defines a through-wafer via that includes a first portion of the semiconductor substrate and a second portion of the semiconductor substrate, wherein forming the annular trench region at the semiconductor substrate comprises the semiconductor substrate comprising a first doped layer of a first conductivity type at a first level and a second doped layer of second conductivity type at a second level overlying the first level; and
forming a transistor at the second portion of the semiconductor substrate and a conductive through-portion at the first portion of the semiconductor substrate.

17. The method of claim 16, further comprising:
doping a portion of the second doped layer of the through-wafer via to be of the same conductivity type as the first doped layer to form a bulk substrate contact through the second doped layer.

18. The method of claim 17, wherein the portion of the second doped layer of the through-wafer via is a majority of the second doped layer.

19. The method of claim 17, wherein the portion of the second doped layer of the through-wafer via is less than a majority of the second doped layer.

20. The method of claim 17, wherein forming the transistor further comprises:
doping a source/drain location at the second doped layer of the through-wafer via to form a source/drain region of the transistor.

* * * * *

UNITED STATES PATENT AND TRADEMARK OFFICE
CERTIFICATE OF CORRECTION

| | | |
|---|---|---|
| PATENT NO. | : 7,705,440 B2 | Page 1 of 1 |
| APPLICATION NO. | : 11/851857 | |
| DATED | : April 27, 2010 | |
| INVENTOR(S) | : James Jen-Ho Wang | |

It is certified that error appears in the above-identified patent and that said Letters Patent is hereby corrected as shown below:

Column 12, Line 7, please change "claim 1" to --claim 4--

Signed and Sealed this
Seventeenth Day of May, 2011

David J. Kappos
*Director of the United States Patent and Trademark Office*